(12) United States Patent
Lin et al.

(10) Patent No.: US 11,456,750 B2
(45) Date of Patent: Sep. 27, 2022

(54) PHASE-LOCKED LOOP CIRCUIT HAVING LINEAR VOLTAGE-DOMAIN TIME-TO-DIGITAL CONVERTER WITH OUTPUT SUBRANGE

(71) Applicant: MEDIATEK INC., Hsin-Chu (TW)

(72) Inventors: Ang-Sheng Lin, Hsinchu (TW); Chun-Wei Chang, Hsinchu (TW); Tzu-Chan Chueh, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/488,339

(22) Filed: Sep. 29, 2021

(65) Prior Publication Data
US 2022/0149849 A1   May 12, 2022

Related U.S. Application Data (60) Provisional application No. 63/112,665, filed on Nov. 12, 2020.

(51) Int. Cl.
  *H03L 7/093*  (2006.01)
  *H03L 7/081*  (2006.01)
  *H03L 7/089*  (2006.01)
  *H03L 7/099*  (2006.01)

(52) U.S. Cl.
  CPC ............ *H03L 7/093* (2013.01); *H03L 7/081* (2013.01); *H03L 7/0895* (2013.01); *H03L 7/0991* (2013.01)

(58) Field of Classification Search
  CPC ....... H03L 7/093; H03L 7/081; H03L 7/0895; H03L 7/0991
  See application file for complete search history.

(56) References Cited

U.S. PATENT DOCUMENTS

| | | | |
|---|---|---|---|
| 6,271,781 B1 * | 8/2001 | Pellon ................... | H03M 3/388 341/143 |
| 6,429,693 B1 * | 8/2002 | Staszewski ............. | H03L 7/091 327/107 |
| 8,553,827 B2 | 10/2013 | Zhang | |
| 9,225,348 B2 * | 12/2015 | Ainspan ................... | H03L 7/085 |
| 9,344,271 B1 * | 5/2016 | Dusatko .............. | H03M 7/3015 |
| 9,588,497 B1 * | 3/2017 | Monk ...................... | H03L 7/093 |
| 9,705,521 B1 * | 7/2017 | Monk .................. | H03M 1/0665 |

(Continued)

FOREIGN PATENT DOCUMENTS

TW          I594581 B     8/2017

*Primary Examiner* — Adam D Houston
(74) *Attorney, Agent, or Firm* — Winston Hsu (57) ABSTRACT

A method of a phase-locked loop circuit includes: using a phase detector to generate a charging current signal according to an input frequency signal and a feedback signal; limiting a voltage level corresponding to the charging current signal in a voltage range according to a prediction signal to generate a digital output; performing a low-pass filter operation according to the digital output; generating a digital controlled oscillator (DCO) frequency signal according to an output of the loop filter; generating the feedback signal according to the DCO frequency signal; generating a phase signal, which indicates accumulated phase shift information, according to information of the feedback circuit and fractional frequency information; and, generating the prediction signal according to the phase signal.

19 Claims, 5 Drawing Sheets

(56) References Cited

U.S. PATENT DOCUMENTS

| | | | | |
|---|---|---|---|---|
| 11,038,521 B1* | 6/2021 | Rafi | ................... | H03M 7/3024 |
| 2004/0232995 A1* | 11/2004 | Thomsen | .............. | H03L 7/0992 |
| | | | | 331/2 |
| 2004/0232997 A1* | 11/2004 | Hein | ....................... | H03L 1/022 |
| | | | | 331/16 |
| 2005/0068118 A1* | 3/2005 | Hein | ....................... | H03L 1/026 |
| | | | | 331/158 |
| 2005/0093591 A1 | 5/2005 | Rhee | | |
| 2006/0119437 A1* | 6/2006 | Thomsen | ................ | H03L 7/197 |
| | | | | 331/10 |
| 2009/0097609 A1* | 4/2009 | Chang | .................. | H03L 7/0991 |
| | | | | 375/376 |
| 2011/0051639 A1* | 3/2011 | Ramakrishnan | .... | H04W 52/028 |
| | | | | 375/316 |
| 2015/0200676 A1* | 7/2015 | Ainspan | ................ | H03L 7/0992 |
| | | | | 327/159 |
| 2016/0079989 A1* | 3/2016 | Ainspan | ................ | H03L 7/1976 |
| | | | | 327/156 |
| 2016/0226656 A1* | 8/2016 | Okada | ....................... | H03L 7/22 |
| 2021/0351780 A1* | 11/2021 | Bal | ...................... | H03M 1/0809 |
| 2021/0391864 A1* | 12/2021 | Rafi | ....................... | H03L 7/143 |

* cited by examiner

PHASE-LOCKED LOOP CIRCUIT HAVING LINEAR VOLTAGE-DOMAIN TIME-TO-DIGITAL CONVERTER WITH OUTPUT SUBRANGE

CROSS REFERENCE TO RELATED APPLICATIONS

This application claims priority of U.S. provisional application Ser. No. 63/112,665 filed on Nov. 12, 2020, which is entirely incorporated herein by reference.

BACKGROUND

Generally speaking, the performance, e.g. an average time interval corresponding to the resolution, of a conventional time-to-digital converter (TDC) circuit such as R-interpolating TDC or phase-shift TDC can be decreased to 0.9 picoseconds or 0.5 picoseconds. However, it is difficult to be further decreased down to 0.3 picoseconds to meet the new requirements of a high speed system. In addition, the conventional TDC encounters the integral nonlinearity (INL) problem which may be caused by a phase detector of the conventional TDC.

SUMMARY

Therefore one of the objectives of the invention is to provide a phase-locked loop (PLL) circuit, a sub-range controlling circuit, and a method of the PLL circuit, to solve the above-mentioned problems.

According to embodiments of the invention, a phase-locked loop (PLL) circuit is disclosed. The PLL circuit comprises a time-to-digital converter (TDC), a loop filter, a digital controlled oscillator (DCO), a feedback circuit, a sigma-delta modulator (SDM), and a prediction circuit. The TDC comprises a phase detector and a processing circuit. The phase detector is used for generating a charging current signal according to an input frequency signal and a feedback signal which is generated from the feedback circuit. The processing circuit is coupled to the phase detector and used for limiting a voltage level corresponding to the charging current signal in a voltage range according to a prediction signal to generate a specific digital output, the prediction signal being generated by the prediction circuit. The loop filter is coupled to the TDC and used for performing a low-pass filter operation according to the specific digital output. The DCO is coupled to the loop filter and used for generating a DCO frequency signal according to an output of the loop filter. The feedback circuit is coupled to the DCO and the phase detector, and it is used for generating the feedback signal according to the DCO frequency signal. The SDM is coupled to the feedback circuit and used for generating a phase signal, which indicates accumulated phase shift information, to the prediction circuit according to information of the feedback circuit and fractional frequency information. The prediction circuit is coupled to the SDM and used for generating the prediction signal according to the phase signal.

According to the embodiments, a sub-range controlling circuit is disclosed. The sub-range controlling circuit is disposed between a charge pump and an analog-to-digital converter (ADC) in a phase-locked loop (PLL) circuit. The sub-range controlling circuit comprises a plurality of capacitor banks and a control logic circuit. Each capacitor bank comprises a plurality of capacitor units and a plurality of switch units. Each capacitor unit has a first terminal coupled to an output of the charge pump and coupled an input of the ADC and having a second terminal. Each switch unit has a first terminal coupled to the second terminal of a corresponding capacitor unit and a second terminal selectively coupled to one of a reference voltage and a ground level. The control logic circuit is coupled to the plurality of capacitor banks, and it is used for limiting a voltage level corresponding to the output of the charge pump in a voltage range by respectively controlling states of switch units in at least one capacitor bank to dynamically adjust down the voltage level for one time or multiple times to generate an adjusted voltage level for the ADC.

According to the embodiments, a method of a phase-locked loop (PLL) circuit is disclosed. The method comprises: using a phase detector to generate a charging current signal according to an input frequency signal and a feedback signal which is generated from a feedback circuit; limiting a voltage level corresponding to the charging current signal in a voltage range according to a prediction signal to generate a specific digital output; using a loop filter to perform a low-pass filter operation according to the specific digital output; using a digital controlled oscillator (DCO) to generate a DCO frequency signal according to an output of the loop filter; using the feedback circuit to generate the feedback signal according to the DCO frequency signal; using a sigma-delta modulator (SDM) to generate a phase signal, which indicates accumulated phase shift information, according to information of the feedback circuit and fractional frequency information; and, generating the prediction signal according to the phase signal.

According to the embodiments, the performance of the PLL circuit can achieve the average time interval corresponding to a small resolution, such as which smaller than 0.3 picoseconds, and can achieve smaller jitter noise.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
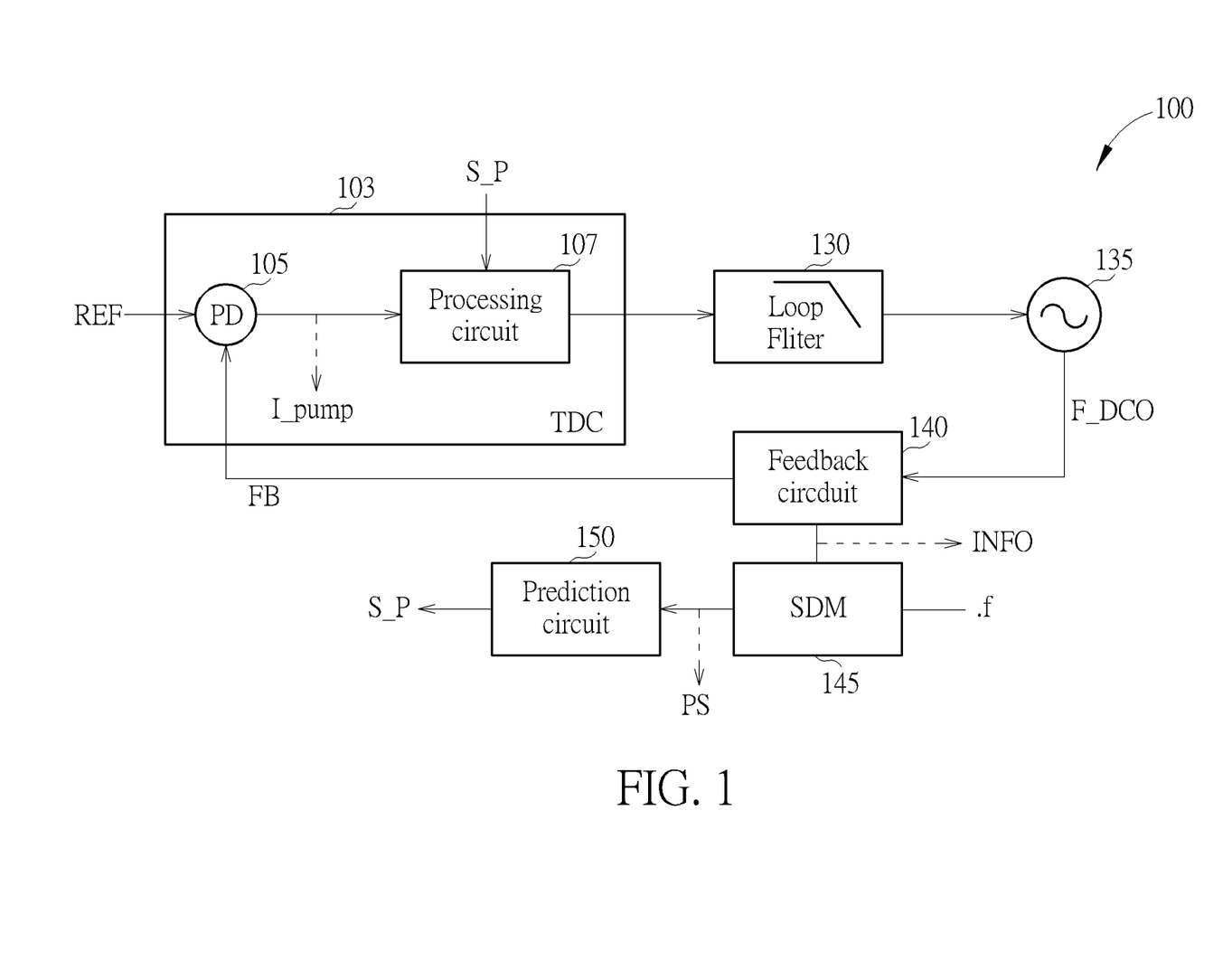
FIG. 1 is a simplified block diagram of a phase-locked loop (PLL) circuit according to an embodiment of the invention.

FIG. 1 is a simplified block diagram of a phase-locked loop (PLL) circuit 100 according to an embodiment of the invention. The PLL circuit 100 for example is an all-digital PLL (ADPLL) circuit. As shown in FIG. 1, the PLL circuit 100 comprises a time-to-digital converter (TDC) 103, a loop filter 130 such as a low-pass filter, a digital controlled oscillator (DCO) 135, a feedback circuit 140 with a sigma-delta modulator (SDM) 145, and a prediction circuit 150, and the TDC 103 comprises an error detector such as a phase detector (PD) 105 and a processing circuit 107. The TDC 103 is used for generating digital output(s) to the loop filter 130 according to the phase/time difference (or shift/error) information on the feedback path of the PLL 100.

The PD 105 is coupled to an input frequency signal such as a reference frequency signal REF and a feedback signal FB which is generated from the feedback circuit 140 which for example may be a clock/edge generator or a multi-modulus divider (MMD). The PD 105 generates a PD output signal such as a charging current signal (or current signal) I_pump according to the reference frequency signal REF and the feedback signal FB and then pumps the current signal I_pump to the processing circuit 107.

The feedback circuit 140 generates the feedback signal FB according to the output frequency signal F_DCO of the DCO 135, and the SDM 145 generates a phase signal PS indicating the accumulated phase shift information based on the information signal INFO from the feedback circuit 140 and the fractional frequency information represented by ".f". The prediction circuit 150 predicts and generates a prediction signal S_P based on such phase signal PS, and the information of the prediction signal S_P is transmitted to TDC 103. The PLL 100 is arranged to track/lock the phase of the frequency signal REF to generate the output frequency signal F_DCO by tracking the phase difference of the two signals.

For a high performance synthesizer, it is needed to implement a TDC with high resolution, however, a phase detector may degrade the signal nonlinearity and introduce the nonlinearity problem into a subsequent circuit such as an analog-to-digital converter (ADC). To avoid or mitigate the nonlinearity problem of the input dynamic range of a circuit component such as an analog-to-digital converter (ADC) used by the processing circuit 107, the TDC 103 limits the output voltage range of PD 105 (e.g. limits an ADC's input voltage range) by adjusting down the output voltage level of PD 105 (e.g. folding the output voltage curve of PD 105) for one time or multiple times according to the prediction signal S_P generated from the prediction circuit 150.

For generating the prediction signal S_P, the prediction circuit 150 at a first timing (or a start timing of the PLL's tracking operation) can predict a future voltage level of the ADC at a N-th timing later than the first timing, which will be increased or raised caused by the current signal I_pump, based on the phase signal PS generated from the SDM 145 at the first timing since the SDM 145 operates based on the fractional frequency information ".f" to obtain the phase signal PS which indicates the accumulated phase that is generated based on a specific step size that is associated with the voltage change of the ADC's input voltage level. The prediction circuit 150 can predict the future voltage levels of the ADC at different future timings, and then it generates and outputs the prediction signal S_P to the TDC 103 (or the processing circuit 107) to control the TDC 103 automatically adjusting down the ADC's input voltage level (e.g. folding the voltage curve of the ADC's input voltage level) at the future timings, automatically compensating the ADC's digital output caused by the voltage folding, and/or automatically compensating the quantization noise caused by the voltage folding.

The prediction signal S_P carries the information of which future timing(s) is/are used to adjust down the ADC's input voltage level and corresponding bit information used for compensating the ADC's digital output after voltage folding, and the TDC 103 (or the processing circuit 107) can accurately control the ADC's input voltage level in a voltage rage with a better linearity and then compensate the ADC's digital output to generate a more accurate digital output signal. This prediction method is more useful in a high speed system since it is difficult to implement instantaneous voltage detection for detecting the PD's output voltage (or ADC's input voltage) in the high speed system. It is easy to implement the prediction method to achieve a linear voltage domain TDC in the high speed system.

Figure 2:
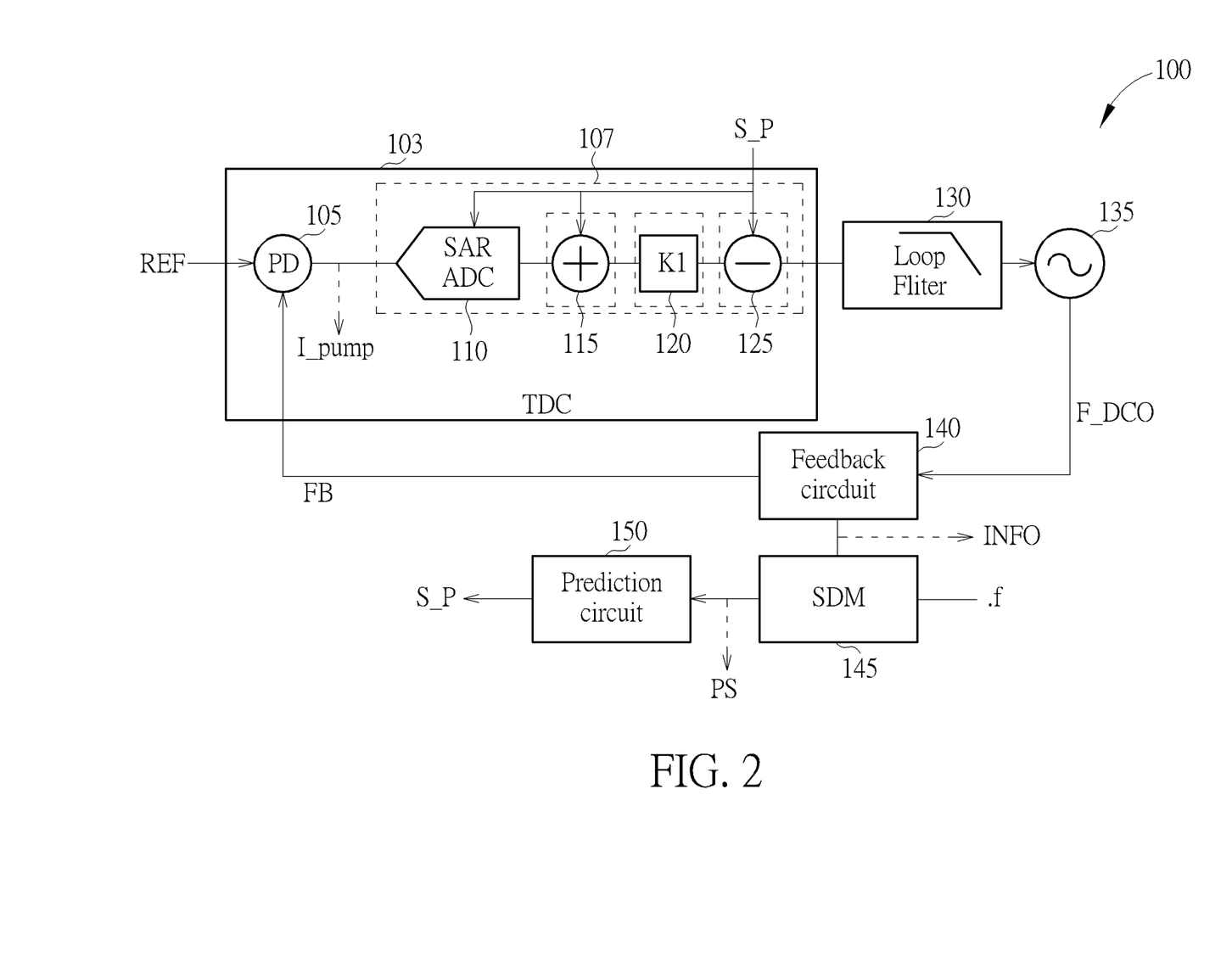
FIG. 2 is a diagram showing an example of the processing circuit of FIG. 1 according to an embodiment of the invention.

FIG. 2 is a diagram showing an example of the processing circuit 107 of FIG. 1 according to an embodiment of the invention. The processing circuit 107 comprises a SAR ADC 110 with successive approximation register (SAR) algorithm/circuit, a compensator unit 115 which is represented by an adder symbol (but not limited), an amplifier unit 120 with a specific gain K1 and a noise cancellation unit 125 such as a quantization noise canceller represented by a subtraction symbol (but not limited). In other embodiments, the noise cancellation unit 125 may be optional and can be excluded from the processing circuit 107.

In this embodiment, the prediction signal S_P is transmitted to the SAR ADC 110, compensator unit 115, and noise cancellation unit 125, respectively. The SAR ADC 110 is used to adjust down the output voltage level of the PD 105 as the output voltage level increases and reaches the future voltage level (s) based on the prediction signal S_P and then is used to perform SAR ADC operation to convert the output voltage level of PD 105 into the digital output. The compensator unit 115 is coupled to the SAR ADC 110 and used for compensating the digital output of the SAR ADC 110 based on the information carried by the prediction signal S_P.

In practice, in one embodiment, the prediction signal S_P may indicate the information of most significant bit(s) (MSB) corresponding to the voltage amplitudes to be adjusted by the SAR ADC 110. After the output voltage level of PD 105 (i.e. the input voltage level of SAR ADC 110) is adjusted by SAR ADC 110 for one time or multiple times, the SAR ADC can execute the ADC operation with SAR algorithm upon the adjusted input voltage level to generate its digital output which is associated with least significant bit(s) (LSB) of the original digital output that is not adjusted by the voltage folding. The compensator unit 115 is arranged to combine the information of MSB with information of LSB to generate a combined digital output which is equivalent or approximate to the original digital output.

The amplifier unit 120 is used to performing an amplifying operation upon the combined digital output with the specific gain K1 to generate an amplified digital output, and the noise cancellation unit 125 is arranged to perform a quantization noise cancellation upon the amplified digital output based on the information of the prediction signal S_P to generate a resultant digital output to the loop filter 130. It should be noted that in some embodiment the noise cancellation unit 125 may perform such quantization noise cancellation upon the amplified digital output without referencing the information of the prediction signal S_P.

Figure 3:
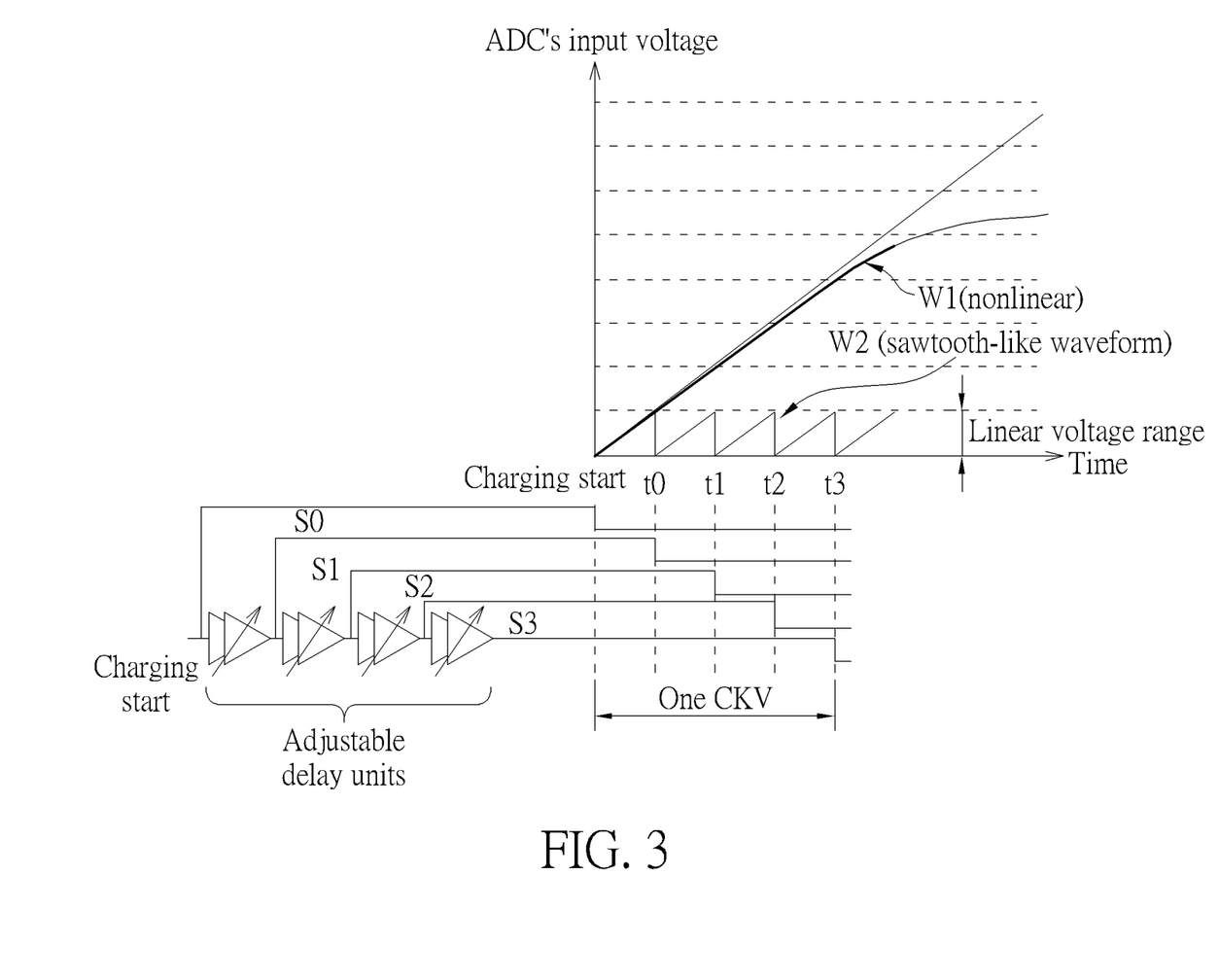
FIG. 3 is a diagram showing an example of adjusting down the PD's output voltage level for multiple times such as four times (but not limited) to generate the sawtooth-like waveform of the input voltage at the input of SAR ADC of FIG. 2 according to an embodiment of the invention.

FIG. 3 is a diagram showing an example of adjusting down the PD's output voltage level for multiple times such as four times (but not limited) to generate the sawtooth-like waveform of the input voltage at the input of SAR ADC 110 of FIG. 2 according to an embodiment of the invention. Based on the prediction signal S_P as shown in FIG. 2, the SAR ADC 110 for example can use a plurality of adjustable delay units (or elements) in FIG. 3 such as four delay units (but not limited) to sequentially delay a charging start signal with the same or different delay amounts respectively so as to generate four different control signals S0, S1, S2, and S3 at four different timings to sequentially trigger/execute the voltage folding operation at the specific predicted timings t0-t3 to sequentially adjust down or fold the original waveform W1 of the input voltage level of the SAR ADC 110 to generate the sawtooth-like waveform W2 so that the input voltage level is kept in the linear voltage range/region. The voltage folding operation can be implemented by using a plurality of capacitor banks in FIG. 5 (but not limited) and is described later; other circuit component(s) may be utilized to implement the voltage folding operation. The adjustment of delay amounts and/or the execution of voltage folding operation can be determined by the SAR ADC 110 based on the prediction signal S_P in FIG. 2. In addition, in one embodiment, the four delay units can be arranged to generate the four control signals S0-S3 to sequentially trigger the voltage folding operation during a time interval such as the time interval disposed between one rising/falling edge of the input reference frequency signal REF and one rising/falling edge of the feedback signal FB. For example, such time interval may be between two rising edges of the signals REF and FB, i.e. one CKV; however, this is not intended to be a limitation of the invention.

Figure 4:
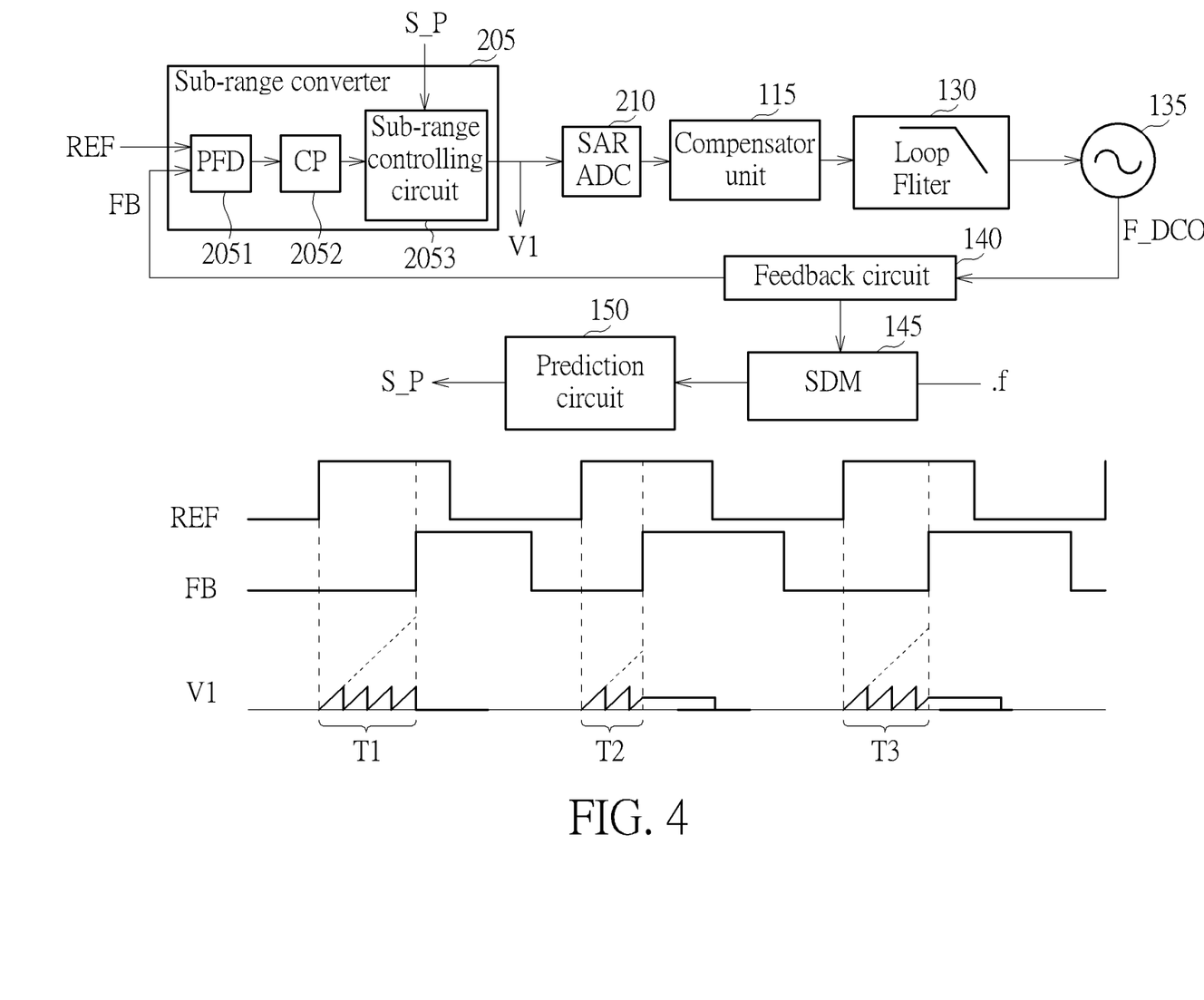
FIG. 4 is a simplified block diagram of a PLL circuit according to another embodiment of the invention.

In other embodiments, the instant application provides a sub-range controlling circuit disposed between a phase detector and an ADC to mitigate or avoid the nonlinearity problems caused by the phase detector. FIG. 4 is a simplified block diagram of a PLL circuit 200 according to another embodiment of the invention. In practice, the PLL circuit 200 for example is an ADPLL circuit and comprises a sub-range converter 205 such as a sub-range time-voltage converter (TVC), a SAR ADC 210, the compensator unit 115, the loop filter 130, the DCO 135, the feedback circuit 140, the SDM 145, and the prediction circuit 150. The sub-range converter 205 comprises a phase frequency detector (PFD) 2051, a charge pump (CP) 2052, and a sub-range controlling circuit 2053. The prediction signal S_P is transmitted to the sub-range controlling circuit 2052 and the compensator unit 115. The PFD 2015 for example generates a corresponding voltage signal according to the reference frequency signal REF and the feedback signal FB and then the CP 2052, based on such corresponding voltage signal, generates the current signal I_pump having a DC value which is linearly proportional to the difference between the phases of two inputs (i.e. the reference frequency signal REF and the feedback signal FB). The sub-range controlling circuit 2053 adjusts down the increased voltage level corresponding to the current signal I_pump for one time or multiple times according to the prediction signal S_P; the voltage adjusting/folding operation is similar to that mentioned above. V1 indicates the sawtooth-like waveform which has been adjusted by the sub-range controlling circuit 2053 and is transmitted to the input of the SAR ADC 210. As shown in FIG. 4, the voltage adjusting/folding operation can be executed during the rising edges of the two signal REF and FB and may be executed for different times such as four times during the interval T1, two times during the interval T2, and three times during the interval T3; this is not meant to be a limitation. After the SAR ADC 210 generates and output the information of LSB, the compensator unit 115 combines the information of LSB with the information of MSB which is indicated by the prediction signal S_P to generate the combined digital output as the resultant digital output that is provided to the loop filter 130.

Figure 5:
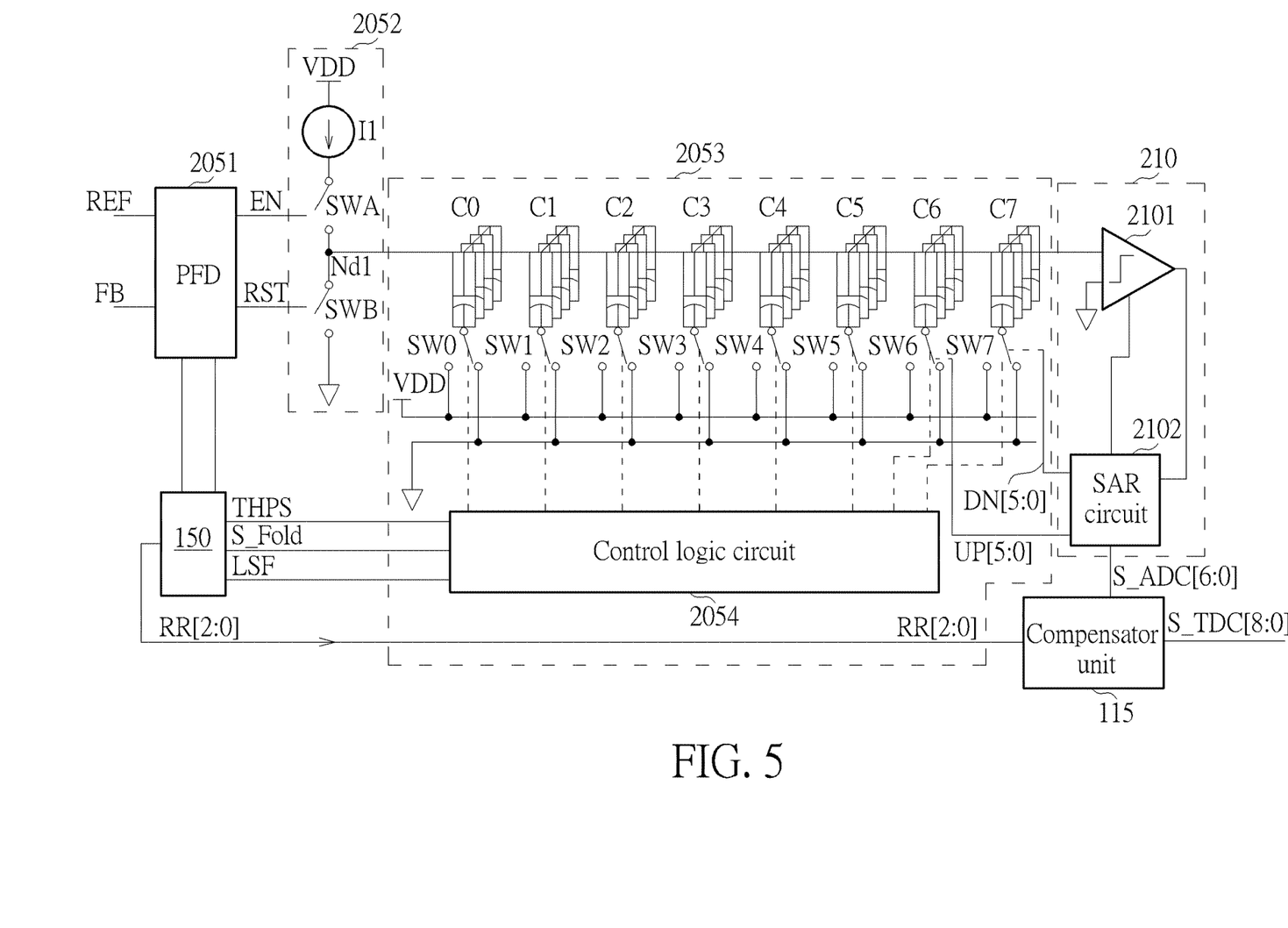
FIG. 5 is a detailed circuit diagram of the sub-range converter, SAR ADC, and the compensator unit in FIG. 4 according to one embodiment of the invention.

FIG. 5 is a detailed circuit diagram of the sub-range converter 205, SAR ADC 210, and the compensator unit 115 in FIG. 4 according to one embodiment of the invention. As shown in FIG. 5, the CP 2052 comprises a current source I1 providing the charge current signal I_pump and further comprises two switch units SWA and SWB which are respectively controlled by the control signals EN and RST generated by the PFD 2051. The SAR ADC 210 comprises an operational amplifier 2101 and an SAR circuit 2102. The sub-range controlling circuit 2053 comprises a control logic circuit 2054 and a plurality of capacitor banks such as $2^N$ capacitor banks. For example, the value of N is equal to 3 (but not limited), i.e. capacitor banks C0-C7. Each capacitor bank may comprise $2^M$ capacitor units and corresponding $2^M$ switch units (only one switch unit (SW0-SW7) of the plurality of switch units are shown in FIG. 5 for simplicity) wherein $2^M$ for example is equal to 64 (but not limited). It should be noted that N and M are respectively different positive integers or may be identical positive integers. Each capacitor unit of each capacitor bank has a first terminal coupled to the intermediate node Nd1 (located between the switch units SWA and SWB), i.e. the output of CP 2052, and has a second terminal coupled to one terminal of a corresponding switch unit which has another terminal that can be selectively coupled to one of a ground level and a reference voltage level such as supply level VDD. Equivalently, the capacitor banks are connected in parallel, and the capacitor units with corresponding switch units are also connected in parallel. The switch units in each capacitor bank are controlled by the control logic circuit 2054.

The prediction circuit 150 generates the prediction signal S_P to the control logic circuit 2054 and compensator unit 115. In practice, the prediction signal S_P for example may comprise the signals THPS, S_Fold, and LSF. The signal THPS indicates the delay amount (s) which is/are used by the control logic circuit 2054 to control the adjustable delay units (similar to those in FIG. 3) to respectively generate the control signals, the signal S_Fold indicates which capacitor bank(s) is/are to be used to execute the voltage folding operation, and the signal LSF indicates which input dynamic range of the SAR ADC 210 is used; the signal LSF can be optional. The prediction signal S_P, transmitted to the compensator unit 115, may comprise the signal RR with MSN information such as three MSB bits represented by RR [2:0] (but not limited).

The control logic circuit 2054 may comprise the above-mentioned adjustable delay units which are connected as shown in FIG. 3; the number of the adjustable delay units are not intended to be a limitation. The control logic circuit 2054 is used for generating the control signals to control the switch units of each capacitor bank turning ON/OFF (i.e. becoming closed/open) according to the prediction signal S_P. According to an embodiment, for the operation, initially before the charging starts, all the switch units of each capacitor bank are selectively connected to the ground level, and the PFD 2051 generates the signal EN and signal RST to control the switch unit SWA becoming open and switch unit SWB becoming closed, to reset the charge of all switch units. After reset, the PFD 2051 generates the signal EN and signal RST to control the switch unit SWA becoming closed and switch unit SWB becoming open, and the control logic circuit 2054 generate the control signals to control all the switch units of each capacitor bank being connected to a reference level such as the voltage supply level VDD. Accordingly, the charging starts, and the current source I1 uses its charging current to charge the level at the intermediate node Nd1, i.e. the input voltage level of SAR ADC 210, and the input voltage level increases with time linearly in the linear voltage range. The control logic circuit 2054 then sequentially generates the control signals such as S0-S3 as shown in FIG. 2 at the different timings by using the circuit design of the delay units, so as to folding the voltage curve of the ADC's input voltage level at the timings t0-t3. It should be noted that the timings are determined based on the delay amount(s) indicated by the signal THPS of the prediction signal S_P generated from the prediction circuit 150.

In addition, the signal S_Fold for example may indicate the capacitor bank numbers to be switched at the timings t0-t3. For instance, based on the information of signal S_Fold, the control logic circuit 2054 may sequentially send the control signals S0-S3 sequentially to control all the switch units respectively represented by SW0-SW3 being switched from the reference level VDD to the ground level at the different timings t0-t3 as shown in FIG. 2, and accordingly the voltage curve of the input voltage level will be folded for four times to generate the sawtooth-like waveform. The SAR ADC 210 determines and generates the digital output S_ADC associated with LSB information represented by S_ADC[6:0], e.g. seven LSB bits, according to the input voltage level that has been adjusted. The compensator unit 115 combines the MSB bits RR[2:0] with LSB bits S_ADC[6:0] to generate the resultant digital output as the TDC's digital output signal S_TDC[8:0] with nine bits resolution.

In one embodiment, the control logic circuit 2054 is capable of finely controlling at least one portion (or all) of switch units of two capacitor banks such as C6 and C7 switching between the ground level and the reference level VDD to generate the digital output signals UP[5:0] and DN[5:0], and then the SAR ADC 210 can overlap the digital output signals UP[5:0] and DN[5:0] to compensate the voltage error or the residual voltage level so as to more accurately generate the LSB bits S_ADC[6:0]. This is not intended to be a limitation.

Further, in another embodiment, the prediction circuit 150 can generate a control signal to the CP 2052 to control the current source I1 providing the charge current I_pump which gradually increases from a lower current to level to a specific current level. For example, when the prediction circuit 150 determines that the initial phase shift is larger, the prediction circuit 150 can control the charge current I_pump gradually or linearly increasing from the lower current to level to the specific current level, to avoid prediction errors. When the prediction circuit 150 determines that the phase shift is or becomes not large, the prediction circuit 150 can control the charge current I_pump at the specific current level. Correspondingly, if the charge current I_pump is controlled by the prediction circuit 150, then the compensator unit 115 correspondingly compensates the ADC's digital output with the prediction signal S_P corresponding to the information of adjusted charge current I_pump to accurately generate the combined digital output for the loop filter 130.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A phase-locked loop (PLL) circuit, comprising:
   a time-to-digital converter (TDC), comprising:
   a phase detector, for generating a charging current signal according to an input frequency signal and a feedback signal which is generated from a feedback circuit; and
   a processing circuit, coupled to the phase detector, for limiting an analog voltage level, provided for an analog-to-digital converter of the processing circuit and corresponding to the charging current signal, in a voltage range according to a prediction signal to generate a digital output, the prediction signal being generated by a prediction circuit;
   a loop filter, coupled to the TDC, for performing a low-pass filter operation according to the digital output;
   a digital controlled oscillator (DCO), coupled to the loop filter, for generating a DCO frequency signal according to an output of the loop filter;
   the feedback circuit, coupled to the DCO and the phase detector, for generating the feedback signal according to the DCO frequency signal;
   a sigma-delta modulator (SDM), coupled to the feedback circuit, for generating a phase signal, which indicates accumulated phase shift information, to the prediction circuit according to information of the feedback circuit and fractional frequency information; and
   the prediction circuit, coupled to the SDM, for generating the prediction signal according to the phase signal.

2. The PLL circuit of claim 1, wherein the processing circuit is arranged for:
   limiting the voltage level corresponding to the charging current signal in the voltage range by dynamically adjusting down the voltage level according to the prediction signal, so as to generate an adjusted voltage level;
   generating a digital output with least significant bit (LSB) information according to the adjusted voltage level; and
   combining the LSB information with most significant bit (MSB) information carried by the prediction signal to generate a combined digital output as the digital output.

3. The PLL circuit of claim 2, wherein the adjusted voltage level is associated with a sawtooth-like waveform signal.

4. The PLL circuit of claim 1, wherein the processing circuit comprises:
   a plurality of adjustable delay units connected in series, for generating a plurality of control signals according to a charging start signal, the plurality of control signals being respectively used to make the voltage level be adjusted down;
   wherein delay amounts of the plurality of adjustable delay units are determined by the prediction signal to determine timings of generating the plurality of control signals.

5. The PLL circuit of claim 4, wherein the plurality of control signals are generated during a time interval specified by a signal edge of the input frequency signal and a signal edge of the feedback signal.

6. The PLL circuit of claim 5, wherein the signal edge of the input frequency signal is a rising edge or a falling edge, and the signal edge of the feedback signal is another rising edge or another falling edge.

7. The PLL circuit of claim 5, wherein the signal edge of the input frequency signal is the rising edge, and the signal edge of the feedback signal is another rising edge.

8. The PLL circuit of claim 2, wherein the processing circuit is arranged for generating the LSB information by overlapping one bit information of a capacitor bank with another bit information of another capacitor bank.

9. A sub-range controlling circuit to be disposed between a charge pump and an analog-to-digital converter (ADC) in a phase-locked loop (PLL) circuit, comprising:
  a plurality of capacitor banks each comprising:
    a plurality of capacitor units each having a first terminal coupled to an output of the charge pump and coupled an input of the ADC and having a second terminal; and
    a plurality of switch units each having a first terminal coupled to the second terminal of a corresponding capacitor unit and having a second terminal selectively coupled to one of a reference voltage and a ground level; and
  a control logic circuit, coupled to the plurality of capacitor banks, for limiting a voltage level corresponding to the output of the charge pump in a voltage range by respectively controlling states of switch units in at least one capacitor bank to dynamically adjust down the voltage level for one time or multiple times to generate an adjusted voltage level for the ADC.

10. The sub-range controlling circuit of claim 9, wherein the control logic circuit is arranged for controlling all switch units in each capacitor bank becoming connected to the reference level and disconnected from the ground level when charging of the charge pump starts.

11. The sub-range controlling circuit of claim 10, wherein the control logic circuit is arranged for controlling switch units of a specific capacitor bank becoming connected to the ground level and disconnected from the reference level at a specific timing to adjust down the voltage level.

12. A method of a phase-locked loop (PLL) circuit, comprising:
  using a phase detector to generate a charging current signal according to an input frequency signal and a feedback signal which is generated from a feedback circuit;
  limiting an analog voltage level, provided for an analog-to-digital converter of the processing circuit and corresponding to the charging current signal, in a voltage range according to a prediction signal to generate a digital output;
  using a loop filter to perform a low-pass filter operation according to the digital output;
  using a digital controlled oscillator (DCO) to generate a DCO frequency signal according to an output of the loop filter;
  using the feedback circuit to generate the feedback signal according to the DCO frequency signal;
  using a sigma-delta modulator (SDM) to generate a phase signal, which indicates accumulated phase shift information, according to information of the feedback circuit and fractional frequency information; and
  generating the prediction signal according to the phase signal.

13. The method of claim 12, wherein the limiting step comprises:
  limiting the voltage level corresponding to the charging current signal in the voltage range by dynamically adjusting down the voltage level according to the prediction signal, so as to generate an adjusted voltage level;
  generating a digital output with least significant bit (LSB) information according to the adjusted voltage level; and
  combining the LSB information with most significant bit (MSB) information carried by the prediction signal to generate a combined digital output as the digital output.

14. The method of claim 13, wherein the adjusted voltage level is associated with a sawtooth-like waveform signal.

15. The method of claim 12, wherein the step comprises:
  using a plurality of adjustable delay units connected in series to generate a plurality of control signals according to a charging start signal, the plurality of control signals being respectively used to make the voltage level be adjusted down;
  wherein delay amounts of the plurality of adjustable delay units are determined by the prediction signal to determine timings of generating the plurality of control signals.

16. The method of claim 15, wherein the plurality of control signals are generated during a time interval specified by a signal edge of the input frequency signal and a signal edge of the feedback signal.

17. The method of claim 16, wherein the signal edge of the input frequency signal is a rising edge or a falling edge, and the signal edge of the feedback signal is another rising edge or another falling edge.

18. The method of claim 16, wherein the signal edge of the input frequency signal is the rising edge, and the signal edge of the feedback signal is another rising edge.

19. The method of claim 13, wherein the processing circuit is arranged for generating the LSB information by overlapping one bit information of a capacitor bank with another bit information of another capacitor bank.

* * * * *